United States Patent [19]

Ehnholm

[11] Patent Number: 5,564,421
[45] Date of Patent: Oct. 15, 1996

[54] VHF APPLICATOR FOR MAGNETIC RESONANCE IMAGING

[75] Inventor: Gosta J. Ehnholm, Helsinki, Finland

[73] Assignee: Instrumentarium Corporation, Helsinki, Finland

[21] Appl. No.: 986,526

[22] Filed: Dec. 7, 1992

Related U.S. Application Data

[63] Continuation-in-part of Ser. No. 680,567, Apr. 4, 1991, abandoned.

[51] Int. Cl.$^6$ .................................. A61B 5/055
[52] U.S. Cl. ...................... 128/653.2; 324/318; 324/322; 324/315; 600/13; 333/219
[58] Field of Search .................... 128/653.2, 653.4, 128/653.5; 324/309, 318, 322, 316; 607/154–156; 600/10, 13–15; 343/895; 333/219

[56] References Cited

U.S. PATENT DOCUMENTS

| | | | |
|---|---|---|---|
| 2,616,046 | 10/1952 | Marston et al. | 343/895 |
| 3,449,752 | 6/1969 | Spitz et al. | 343/895 |
| 3,509,578 | 4/1970 | Cribb | 343/895 |
| 4,680,548 | 7/1987 | Edelstein | 324/318 |
| 4,783,641 | 11/1988 | Hayes et al. | 333/219 |
| 4,918,388 | 4/1990 | Mehdizadeh et al. | 128/653.5 |
| 4,931,734 | 6/1990 | Kemner et al. | 324/318 |
| 4,984,573 | 1/1991 | Leunbach | 128/653.4 |
| 5,045,792 | 9/1991 | Mehdizadeh | 324/318 |
| 5,233,303 | 8/1993 | Bales et al. | 324/316 |

FOREIGN PATENT DOCUMENTS

| | | |
|---|---|---|
| 0347180A2 | 12/1989 | European Pat. Off. . |
| 2968332 | 2/1988 | United Kingdom . |

OTHER PUBLICATIONS

Lauterbur; Nature, 242:190–191 Mar. 1973.
Steinberg, A. J. R., 147: 453–454 Sep. 1986.
Steiner; A. J. R. 145: 883–893 Nov. 1985.
Bottomley; Rev. Sci. Instrum., 53:1319–1337 Sep. 1982.
Hinshaw et al.; Proc. IEEE; 71:338–350 Mar. 1983.
House; IEEE Trans. Nuc. Sci.; NS–27: 1220–1226 Jun. 1980.
Koutcher et al.; J. Nucl. Med.; 25:371–382 1984.
Pykett; Radiology; 143:157–168 Apr. 1982.
Twieg; Med. Phys.; 10:610–621 Sep. 1983.
Lurie et al.; J. Magn. Reson.; 76:360–370 1988.
Sepisnik et al.; Soc. Magn. Res. in Med.; 7th Annual Meeting; 20–26; 1060 Aug. 1988.
Hand et al.; Electronic & Electrical Research Studies Physical Tech. in Clin. Hyperthermia; 159–187 1987.
S. Ranno et al.; "Fields and Waves in Communication Electronics"; pp. 474–479 no date.
M. Savelainen; Acta. Poly. Scan. Ph. 158 May 1988.

*Primary Examiner*—Krista M. Zele
*Assistant Examiner*—Brian L. Casler
*Attorney, Agent, or Firm*—Chilton, Alix & Van Kirk

[57] ABSTRACT

An applicator for coupling an electromagnetic field to a sample to be imaged by magnetic resonance imaging, comprising an electrical periodic structure constructed so as to oscillate with substantially the same phase over its whole length.

35 Claims, 3 Drawing Sheets

VHF APPLICATOR FOR MAGNETIC RESONANCE IMAGING

CROSS-REFERENCE TO RELATED APPLICATION

This application is a continuation-in-part of application Ser. No. 680,567 filed Apr. 4, 1991 now abandoned.

The present invention relates to improvements in an relating to methods of magnetic resonance imaging and apparatus therefor.

Magnetic resonance imaging (MRI) is a non-invasive imaging technique which is achieving progressively wider acceptance by physicians for use in medical diagnoses. The technique was developed by Lauterbur who published the first magnetic resonance (MR) images in 1973. By 1985, at least 500 MR imagers had been installed for clinical use around the world (see for example Lauterbur, Nature 242: 190–191 (1973), Steinberg, A. J. R. 147: 453–454 (1986) and Steiner, A. J. R. 145: 883–893 (1985).

MR images are generated by manipulation of the MR signals detected from a sample, for example a human or animal body, placed in a magnetic field and exposed to pulses of radiation, typically radio frequency (RF) radiation, of a frequency selected to excite MR transitions in selected non-zero spin nuclei (the "imaging nuclei") in the sample.

In order to encode spatial information into the MR signals during the imaging procedure, the magnetic field experienced by the sample is modified by the imposition onto a primary uniform magnetic field B of magnetic field gradients. Thus, for example, since the resonating frequency of an imaging nucleus is dependent on the strength of the magnetic field (B) in which it lies as well of course as on factors such as the chemical environment and the isotopic nature of the nucleus (which may for example be $^1H$, $^{13}C$, $^{19}F$), by imposing a field gradient in the z direction on the sample during periods during which the sample is exposed to pulses of the MR transition exciting radiation, the position and width in the z direction of the slice through the sample in the xy plane from which the MR signals are emitted is defined by the strength of the primary field $B_o$, the applied field gradient dB/dz, and the frequency and bandwidth of the exciting pulses.

Subsequent imposition of further field gradients in the period between the initial pulse of the MR transition exciting radiation and the period during which the MR signal is detected and also during the period of detection can similarly encode x and y spatial information into the MR signal.

There are several different encoding techniques known in the art, but all rely upon the imposition onto the primary field of field gradients of different magnitudes and/or in different directions, in particular sequences within the MR-transition-excitation/MR-signal-detection cycles.

Moreover, using different pulse and detection sequences, for example spin echo, spin inversion, spin recovery, etc., different types of MR images can be generated from the detected signals, for example images in which the pixel intensity is proportional to the density of the imaging nuclei in the corresponding volume element of the sample (e.g., proton density images), $T_1$ and $T_2$ images.

For a general discussion of the principles of MRI, the reader is referred to the articles by Bottomley, Rev. Sci. Instrum. 53: 1319–1337 (1982), Hinshaw et al., Proc. IEEE 71: 338–350 (1983), House, IEEE Trans. Nucl. Sci. NS-27: 1220–1226 (1980), Koutcher et al., J. Nucl. Med. 25: 371–382 (1984), Mansfield et al. in "Advances in Magnetic Resonance" edited by Waugh, Academic Press, New York (1982), Pykett, Sci. Am. 146: 54–64 (1982), Twieg, Med. Phys. 10: 610–621 (1983) and Kean et al "Magnetic Resonance Imaging" Heinemann, London (1986).

In an MR imager, the primary magnetic field $B_o$ is conventionally generated by a superconducting magnet, a resistive magnet or a permanent magnet. The choice of the primary magnetic field strength used in MRI affects the quality and characteristics of the images that can be generated and also affects the image acquisition time and the manufacturing and running costs of the MR imager. Thus, for example, for a given image acquisition procedure, the use of higher strength primary fields results in improved signal to noise (S/N) ratios. As a result, the best MR images that have so far been obtained have been produced using the large primary magnets. This is because such magnets give very strong, stable and homogeneous fields while at the same time providing some shielding against external perturbing magnetic fields. The disadvantages, however are that such magnets are very expensive and are very difficult to service and maintain and also that it is now recognized-that there are dangers associated with the use of high fields.

At lower fields, for example 2000 gauss, resistive magnets may be used, and at fields of 200 gauss or less such magnets are quite inexpensive and simple to operate and install. At low fields, however, technical problems arise, in particular the poor S/N ratio which results from the low MR signal amplitude and frequency.

This technical problem has been addressed in a variety of ways. Thus, for example Hafslund Nycomed in PCT/GB88/00479 (published as WO-A-88/10419) and Lurie et al. in J. Magn. Reson. 76: 360–370 (1988) have described the use of dynamic polarizaton, produced by stimulation of coupled ESR (electron spin resonance) transitions to increase signal strength, and Stepisnik et al. in Society of Magnetic Resonance in Medicine, Seventh Annual Meeting, 20–26 Aug. 1988, page 1060, have suggested that polarization may be enhanced by pulsing the imaging nuclei with a higher magnetic field prior to detection of the MR signals. It is also possible to increase the S/N ratio by decreasing the noise of the MR signal detector, the RF receiver coil, by cooling it with liquid nitrogen and/or by making it of a superconductive material.

This invention relates to improvements in methods of magnetic resonance imaging using NMR and/or ESR signals, including methods relating to said use of dynamic polarization, also referred to as the Overhauser effect. Overhauser effect magnetic resonance imaging, or ESR enhanced MRI, uses ESR to enhance the nuclear polarization, and thus the image signal strength. The enhancement factor E can be quite big, up to several hundred. During the scan the patient to be imaged is, for instance, injected with the paramagnetic agent used for the Overhauser effect and as an end result an image is obtained in which the regions affected by the agent are highlighted.

The advantages of ESR enhanced MRI are thus a greatly improved signal-to-noise ratio and good outlining or contrast of the enhancement medium. The method needs, however, in addition to the equipment used for ordinary MRI, means for stimulating the ESR.

The range of ESR frequencies of interest in ESR enhanced MRI is typically in the range of hundreds of megahertz, often designated as the VHF region, though UHF to a few gigahertz might be used in special cases. Corresponding wavelengths inside the human body are typically 3–30 cm, which is comparable to or shorter than the region of interest to be imaged. The wave nature of the VHF signal thus has to be taken into account when designing the means for applying it. Said means we will henceforth call "applicator", conforming with the terminology in hyperthermia, where similar problems arise (hyperthermia is a method whereby selective heating is applied to the human body for therapy, for instance using electromagnetic radiation). Alternatively we use the word "antenna".

In the design and use of VHF applicators for hyperthermia some general rules have been found (ref. to Proc. of the NATO Advance Study Institute on "Physics and Technology of Hyperthermia" Urbino Italy July-August 1986, Martinus Nijhoff, Publ. 1987, especially pp. 159–187).

The applicator active region or aperture can be modelled by a distribution of electric and magnetic dipoles, oscillating at the VHF signal frequency and thus radiating an electromagnetic wave. The electric and magnetic fields are grouped into a "far-field" part, which travels with the wave, and "near-fields", which remain local near the aperture. In strongly attenuating media, such as the body, the distinction becomes blurred. The electric fields produce heat in the patient tissues, which usually becomes a problem for ESR enhanced MRI and at best is unnecessary. The magnetic field of the electromagnetic radiation gives the wanted ESR effect. The two far-fields are simply interconnected via the Maxwell equations and always accompany each other. In the near-field region the interdependence is more complicated and less stringent. Therefore the electric near field can and should be minimized, being an unnecessary nuisance.

The individual dipoles of the model have strong electric near fields. Those of the electric dipoles are especially strong and depend on distance as $1/r^3$. Magnetic dipoles have weaker near fields with dependence $1/r^2$. When the dipoles are combined to a continuous aperture, the near fields tend to cancel and for a large optimized aperture the field becomes progressively more like a plane wave. Near fields from accumulated charges in systems where they are unevenly distributed are especially strong, causing local "hot spots" in the imaging region. Therefore, the applicator should be designed to have an even distribution of charges and also of currents.

In practice the optimal electromagnetic field for ESR in the human body at the frequencies of interest, with the applicator optimized for minimum electric near field is close to a transverse electromagnetic (TEM) field. In this case, the ratio of electric to magnetic field in the body is determined by the properties of tissue and equal to the so-called intrinsic impedance of the tissues, which has a magnitude of, very roughly, ohms. In vacuum the ratio is 377 ohms. To keep heating down at the surface of the body, the applicator should be "impedance matched" to the body to give a ratio of fields equal to or less than 50 ohms.

A good VHF applicator (or antenna) should satisfy the following requirements:

it should give an even field distribution in the region of interest and not produce any "hot spots". This is very important.

It should give a circularly polarized field in the sense (i.e., right handed or left handed) of the precessing electron spins to minimize rf heating effects. Linearly polarized fields contain a circulating polarization component in the opposite sense which gives extra heat without any ESR effect.

It should have a good efficiency, meaning that most of the VHF power should pass into the patient to be imaged rather than be dissipated in the antenna itself.

It is, furthermore, an advantage that the applicator has a simple mechanical design in the sense of being inexpensive to build and having a small influence on the losses of the surrounding NMR coil. To this end, it helps if the VHF power can be fed to the applicator in one or two regions only, for instance at one end of the applicator, a multiplicity of feed lines entering at different points being expensive and difficult to combine with the NMR coil. The present invention shows how this can be done and simultaneously a good VHF field profile be obtained.

To further explain the difficulties involved, we study the fictional head applicator shown in FIG. 1. The VHF signal is fed into the helmet-shaped system from the left and we imagine that it progresses through the applicator with some wavelength $L_a$. The "aperture" of the applicator is formed by the inner surface of the helmet.

In systems designed for frequencies around and below 100 MHz, like the NMR signal in ordinary MRI scanners, the applicator has traditionally been some simple coil arrangement, the corresponding $L_a$ is then much longer than the length of the helmet. We are presently concerned with higher frequencies, typically 300 MHz, with correspondingly shorter wavelengths. For tissues, the wavelength at 300 MHz is $L_b$=11 cm. Impedance matching, in the sense explained above as needed to lower electric power dissipation in tissues, usually requires that $L_a$ is about equal to just somewhat bigger than $L_b$. The assumptions for $L_a$ and $L_b$ in the figure are thus valid.

We assume further that the VHF wave-fronts in the helmet lie approximately in planes which are perpendicular to the dc field direction ($B_o$) and that the wave having reached the end of the helmet is reflected back. Incident wave-fronts are drawn with solid and reflected ones with dashed lines. We finally assume that the fields of the waves in the helmet couple to the head so as to induce a circularly polarized wave in the head.

This applicator fulfills some of the listed criteria for a good system but it has a drawback: The reflected wave in the helmet induces a corresponding one in the head which will form an interference pattern with the original wave. In FIG. 1, the dotted line indicates one region where the two waves in the head will interfere either constructively to form a maximum or destructively for a minimum. This type of uncontrollable interference is not desirable.

According to the invention, we provide a method of magnetic resonance imaging comprising applying a magnetic field to a sample to be imaged, applying pulses of MR transition-exciting electromagnetic radiation to the sample, applying pulses of electromagnetic radiation to the sample for stimulating coupled ESR transitions and detecting the resulting radiation from the sample with an NMR-signal detector, characterised by applying the ESR pulses through an electrical periodic structure constructed so as to oscillate with substantially the safe phase over its whole length.

Viewed from another aspect, the invention provides magnetic resonance imaging apparatus comprising means for applying a magnetic field to a sample to be imaged, means for applying pulses of MR transition-exciting electromagnetic radiation to the sample, an NMR signal detector for detecting the resulting radiation from the sample, and applicator means for applying pulses of electromagnetic radiation to the sample for stimulating coupled ESR transitions, characterised in that the applicator means comprises an electrical periodic structure constructed so as to oscillate with substantially the same phase over its whole length.

Viewed from yet another aspect, the invention comprises an applicator for applying an electromagnetic field to a sample to be imaged by magnetic resonance imaging, comprising an electrical periodic structure constructed so as to oscillate with substantially the same phase over its whole length.

Periodic structures are described for instance in "Fields and Waves in Communication Electronics" by S. Rano, J. R. Whinnrey and T. Van Duzer (John Wiley & sons 1965) pp. 474–479. Such structures are formed by cascading electromagnetically identical components to a chain. It can be shown that such a chain will transmit waves, somewhat like transmission lines. Usually they transmit only within certain allowed frequency bands with "forbidden" regions in between. The limiting-frequency between the bands are called cutoff frequencies. At some of these, the wavelength is infinite. Using this feature a periodic structure can be designed that oscillates with the same phase over its whole length without any standing wave nodes. The phase velocity along this structure is infinite.

Preferably, the periodic structure is constructed so as to produce a rotating magnetic field in the sample. Preferably there is provided a first linear periodic structure comprising series inductances alternating with Shunt capacitances, and a second similar linear periodic structure, the magnetic axes of the inductances of the first and second structures being perpendicular and the two structures being fed in quadrature. Alternatively, the periodic structure may comprise coupled resonance circuits comprising pairs of coils tuned to slightly different frequencies.

Preferably the periodic structure is arranged to produce a plane wave with circular polarization. In use, such wave will be arranged to travel in the direction of the d.c. field. This can be achieved by arranging the direction of the local magnetic fields of successive sections of the applicator to be twisted by a certain angle around the lengthwise axis of the structure, so that the field forms a helix. The pitch of the helix is preferably substantially equal to the wavelength in the sample of the ESR pulses so as to produce said planewave. Alternatively, however, the pitch can be somewhat longer to produce a focusing effect.

The periodic structure may be equally employed in ordinary MRI apparatus for analysing NMR signals, or similar apparatus but which is for analysing ESR rather than NMR signals. In the latter case the paramagnetic electron spins take the role of the proton spins in the NMR analysis. A plurality of periodic structures can be used, with, for example, one structure applying the MR-transition-exciting electromagnetic radiation, and another the ESR-transition-exciting radition, or functioning as part of the MR signal detector.

Certain embodiments of the invention will now be described by way of example and with reference to the accompanying drawings, in which.

Figure 2:
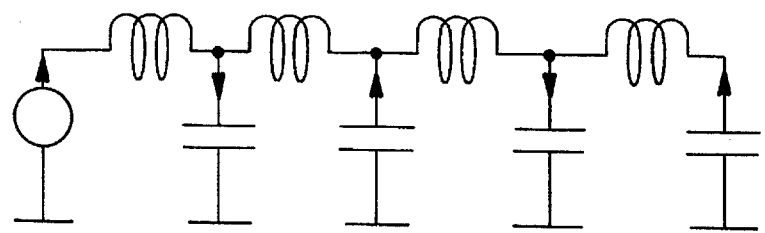
FIG. 2 is a circuit diagram of an electrical periodic structure.

A simple example of a periodic structure is shown in FIG. 2. The oscillator feeds the structure and the elements, capacitors and inductors, are chosen so as to give a resonance with the same current at any moment of time in inductors 1,3 and so on and the opposite current in inductors 2,4 . . . ; at this frequency the phase velocity along the structure is infinite and we are rid of standing-wave nodes. This is important to the invention.

The invention can be further varied to give it beneficial properties for different uses. One important property is to produce a rotating magnetic field at any point at least in most of space to keep down unnecessary heating. This can be accomplished in at least two ways:

One method is to start by designing all the coils of FIG. 2 to produce, at some specific moment, a field in, say, the x-direction. A second similar linear structure is subsequently integrated with the first one but turned 90° around the z-axis, which is defined to be along the structure, so as to let the coils produce fields in the y-direction. This structure is fed from a signal source oscillating in quadrature (90°) with respect to the one feeding the original structure. The field at each pair of coils will then rotate. This is the first method.

The other method is to take pairs of coils, tuned with their own capacitors to slightly different frequencies. These pairs are connected in a chain using capacitive or/and inductive coupling. Each such pair or section gives a local rotating magnetic field provided that the coupling to each coil in the pair is similar and of suitable strength. For more information about the use of such coupled resonance circuits giving rotating fields see M. Savelainen's "Magnetic Resonance Imaging at 0.02T: Design and Evaluation of Radio Frequency Coils with Wave Winding", Acta Polytechnica Scandinavica, Ph 158, Helsinki 1988.

The final variation of the invention is to tailor it to couple to some particular motional mode of waves in the object to be imaged. A simple such mode which has the advantage of providing a uniform VHF field which couples well to the processing spins is a plane wave with circular polarization progressing in the direction of $B_o$, the dc magnetic field. The applicator can be shaped to couple to such a wave in the following way:

Each section of the linear structure is formed so as to give a direction of the local rotating magnetic field which at some specific moment of time is twisted around the lengthwise direction of the structure by a certain angle with respect to the previous section. The VHF field produced by the complete structure in the region of interest thus forms a helix twisting round the lengthwise direction of the linear structure, which should, in turn, be made to coincide with the direction of $B_o$.

Figure 1:
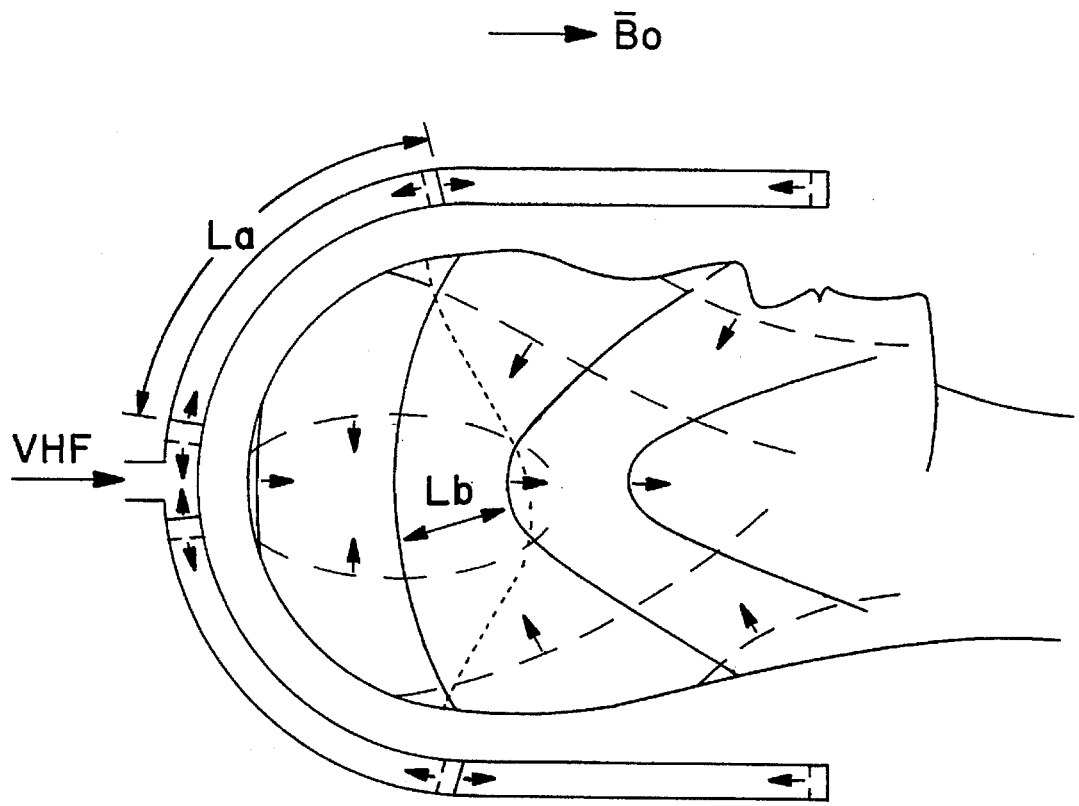
FIG. 1 is a schematic view of a VHF applicator for the head, illustrating the undesired interference effects.

The rotating helical field couples efficiently to circularly polarized waves travelling in a specific direction in the object being imaged. If the pitch of the helix is chosen to be equal to the VHF wavelength in the body we will couple to plane waves. If the pitch is chosen to be longer we can bend the wave-front to produce focusing of the wave. This is all seen from FIG. 1, where now $L_a$ can be interpreted to be the pitch. The effect of using the invention is, firstly, that either what used to be the reflected wave, or the incident one, is eliminated. This eliminates the interference. The second effect, focusing, has been obtained by choosing $L_a$ to be bigger than $L_b$ which gives a bend in the wavefronts.

We will next present two preferred embodiments of the invention.

Figure 3A:
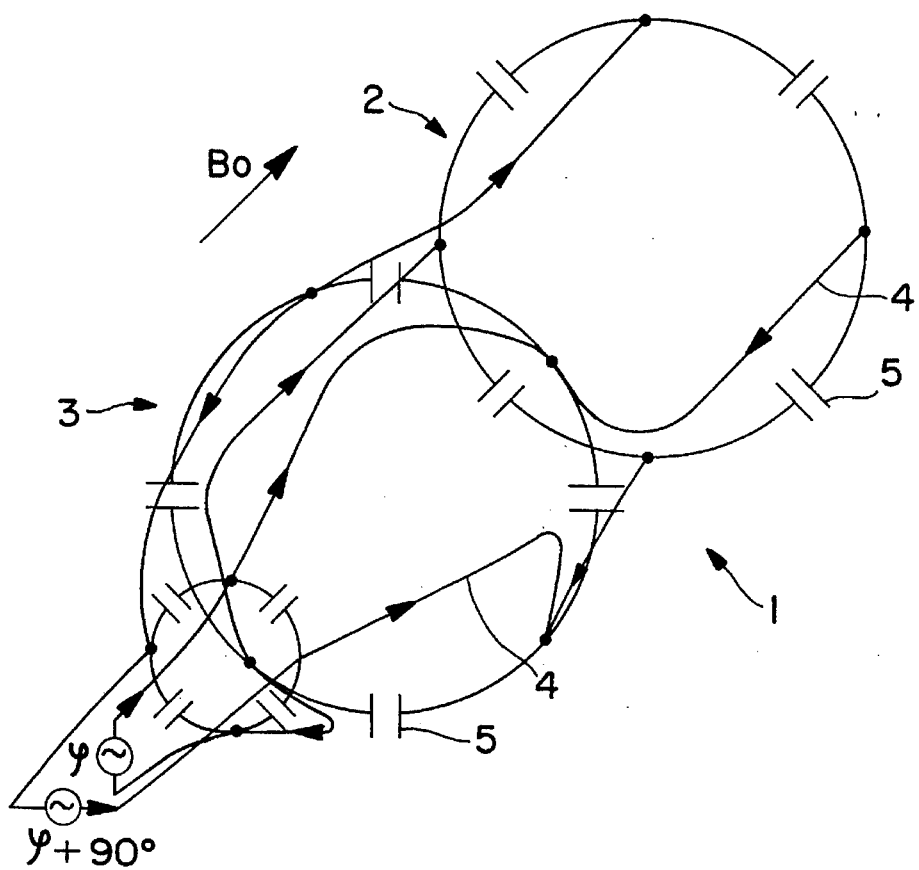
FIGS. 3A and 3B are schematic representations view of an applicator for the head according to the invention.
Figure 3B:
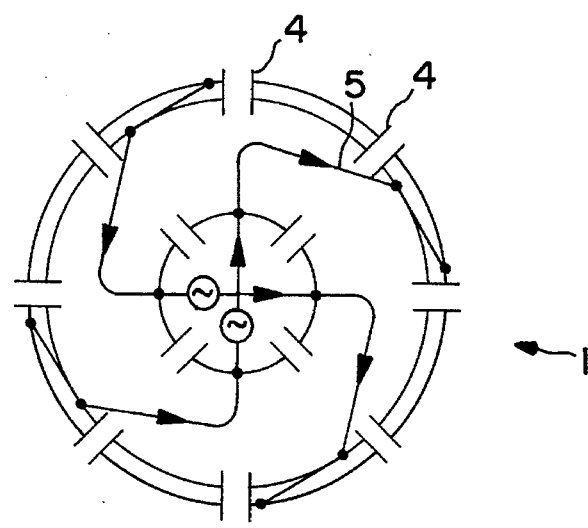

To construct the applicator, firstly the frequency to be used must be decided. This depends upon the special needs of the given application. From this frequency the approximate corresponding wavelength of electromagnetic radiation in the human body, called $L_b$ in FIG. 1, and thus the basic periodicity $L_a$ to employ in the periodic structure of FIG. 2, may be calculated. Then a mechanical design for the part of the body to be imaged must be constructed. FIGS. 3A and 3B show a somewhat simplified applicator 1 for the head, which comprises a volume coil. The coil will e.g. be built on a plastic support with low losses, like polyethylene or polystyrene, which is formed to fit the desired part of the human body.

The coil in FIGS. 3A and 3B contains two sections, 2, 3 each with four lengthwise wires 4 connected by four capacitors 5. The current directions for a certain moment of time are indicated. The sections each give a rotating magnetic field perpendicular to $B_o$ inside and they are twisted by 90° to each other to give total helical field pattern in the shape of a quarter turn helix. More sections can be added, each adds another quarter turn.

The conducting wires, which may be made from copper strips, tube or wire or the equivalent, are fastened on the plastic support. This is standard practice when making MRI receiver coils. When operating at low frequencies, below 50 MHz or thereabouts, such coils usually have several turns of conductor, but at the high frequencies contemplated herein, 100 MHz and above, the conductor forms only single loops, as shown in FIGS. 3A and 3B.

The conductors are next joined together by the capacitors. To find the optimal length of conductors and the correct value of the capacitances the following experimental method, known to those working with high frequency equipment, may be used.

The capacitances are first estimated by a rule-of-thumb as follows. At the frequencies of interest the conductor strips act locally as transmission lines, with a line impedance of 50–200 ohms. In order for a design like the one shown in FIG. 3 or FIG. 4 to induce the desired magnetic field into the region of interest the currents in the strips should have the indicated phases, which should be approximately constant in each strip. Therefore the strips must be short compared to the wavelength of electromagnetic radiation at the chosen frequency. A suitable length is one eight of wave-length (or less), to make the phase constant within approximately 45 degrees. The strip is then joined to the next one with a series capacitor, which corrects for its phase-lag of 45 degrees and adds additional phase where needed. The capacitors are therefore chosen as trimmer capacitors with a middle value that gives a reactance of 50–200 ohms at the chosen frequency, which corresponds to the said 45 degrees phase correction. Typically one would take 1–10 picofarads when working at 300 MHz. The above rule for the length of strips between capacitors would in FIG. 3 mean that in some cases extra capacitors would be added at the position of the arrow-heads designating the current direction in the strips.

The rule-of-thumb is simply: use 1–10 picofarad trimmer capacitors for frequencies around 300 MHz. At other frequencies change these values roughly inversely proportionally to the frequency.

A prototype is then built with trimmer capacitors which can be trimmed around the estimated value. Trimming is made using a sweep generator to find the right resonant frequencies, together with a magnetic field probe to measure the profile of the magnetic field. The capacitance values are changed until the desired shape of the magnetic field is found. During this process the frequency is swept around the desired working frequency all the time in order to see the resonance of the system. Thus the field profile of the system as a function of the frequency may be found. Once trimming is completed some of the capacitors can be measured and exchanged for fixed-value ones, if desired.

Shielding may be added around the applicator to avoid it interacting too much with the surroundings. In this way it will keep tuned to the right frequency and not radiate disturbing signals or suffer form external interference.

As an alternative to the above, there are, in principle, mathematical methods to compute the value of the capacitors and length of conductor strips. These can be found in text-books, e.g. "Fields and Waves in Communication Electronics", pp. 474–479, or "Field Theory of Guided Waves" by Robert E. Collin, IEEE-press 1960 and 991 pp. 605–640. However, the outlined practical methods are the accepted ones in practice. The work spent in the calculations to find out the value of inductances and stray capacitances is generally larger than that involved in making a prototype.

A more practical applicator would have more lengthwise wires for more even field distribution and less near field effects (hot spots). The next step in this direction is taken by adding another four wires to each section, at equal angular distance from the existing ones, together with four more capacitors to each ring shaped arrangement between sections.

The applicator can also be combined with the RF coil to have some parts in common. The S-shaped lines in FIG. 3B can each form a part of one of the turns in the RF coil. The remaining parts of said turns will now tend to short the indicated feed points. The applicator can instead be fed by placing another similar periodic structure around it. This feed applicator can be made simple with only a few wires, like in FIGS. 3A and 3B, and optimized for a good matching to the signal source. The inner structure, having many wires, will distribute currents and fields evenly around the object to be imaged and thus eliminate hot spots.

The signal sources used consist of an oscillator followed by a linear amplifier and a hybrid power divider, which divides the signal into two components which have equal amplitude but differ in phase by 90 degrees, either as an integral unit or formed by connecting the individual components in cascade. Standard methods of impedance matching are used between signal source and coil to ensure that the signal power goes into the coil, rather than being reflected. The components are normally parts of the MRI apparatus that the applicator is to be used with.

Figure 4:
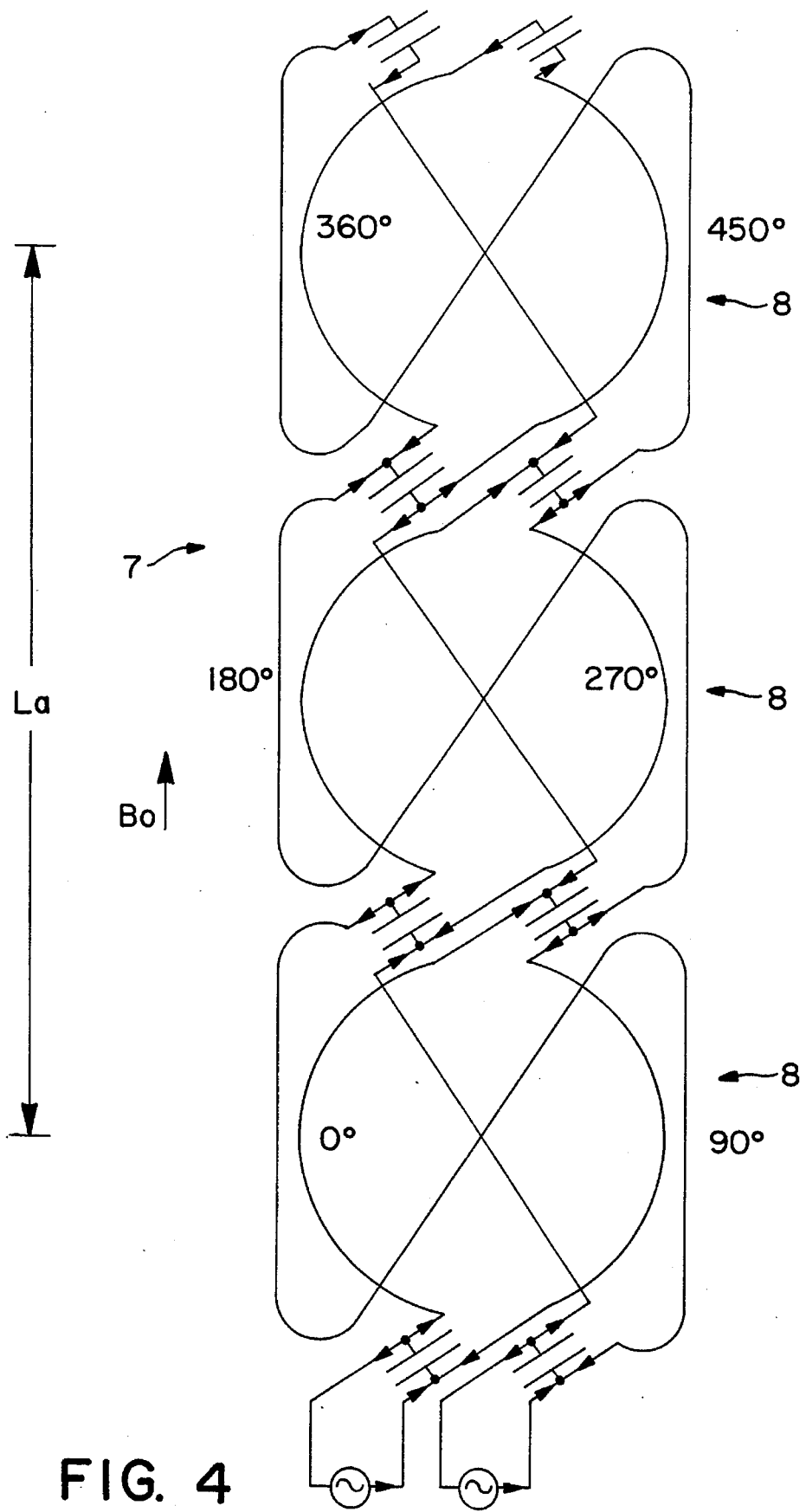
FIG. 4 is a schematic view of an applicator for the spine according to the invention.

Another version of the invention is the spine applicator 7 shown in FIG. 4. This applicator contains three sections 8 in a plane, thus forming a surface coil. The magnetic field in the region above the plane makes a 180° helical twist. Signal current phases are indicated by numbers and field directions by arrows.

Another use of the VHF applicator is for use as an RF coil for nuclear magnetic resonance in high-field MRI machines. The advantage is that the phase of the protons can be arranged in a controlled way because the proton resonance signal can be made to form a plane wave in the object to be imaged. In a spin-warp imaging sequence, which is the most common type in use, the phase-code direction can be chosen along the direction of propagation of this wave. The result is that phase coding of the image can be made in the usual manner. The phase distortion caused by the finite phase velocity of the electromagnetic wave which communicates the excitation and subsequent response of the proton is now eliminated because the wave fronts are along the equal phase lines in the object and the phase velocity along wave fronts is infinite.

The applicator may also be used in ordinary MRI apparatus for transmitting and receiving the NMR signal using a constant phase periodic structure, and in a similar apparatus using ESR instead of NMR, for transmitting and receiving the ESR signal.

What is claimed is:

1. An applicator for use in a magnetic resonance imaging apparatus employing dynamic polarization, said applicator coupling an electromagnetic field having a frequency above 100 MHz to a sample to be imaged, said applicator comprising an electrical periodic structure having a length, said applicator receiving an output signal from an oscillator and generating said electromagnetic field wherein said field has a phase, said electrical periodic structure being constructed to cause said generated electromagnetic field to oscillate with substantially the same phase over the whole length of the electrical periodic structure in response to said oscillator output signal, said applicator further generating an ESR resonance signal and coupling the ESR resonance signal to the sample via said electrical period structure.

2. An applicator according to claim 1 further comprising, means to focus the electromagnetic field into some region of interest wherein said means to focus comprises means to counteract attenuation of the electromagnetic radiation in the sample so as to produce an approximately homogenous VHF field in at least part of said sample.

3. An applicator according to claim 2 wherein said means to focus comprises means to decrease noise coupling to the applicator from outside said region of interest.

4. An applicator according to claim 1 wherein said electrical periodic structure includes a first linear periodic structure comprising series inductances alternating with shunt capacitances, and a second linear periodic structure comprising series inductances alternating with shunt capacitances, the magnetic axes of the inductances of said first and second linear periodic structures being perpendicular and said two linear periodic structures being fed in quadrature.

5. An applicator according to claim 1 wherein said periodic structure includes coupled resonance circuits comprising pairs of coils tuned to slightly different frequencies.

6. A method of magnetic resonance imaging comprising applying a magnetic field to a sample to be imaged, applying pulses of MR transition exciting electromagnetic radiation to the sample, applying pulses of the electromagnetic radiation having a frequency above 100 MHz to the sample for stimulating coupled ESR transitions and detecting the resulting radiation from the sample with an MR signal detector, further applying ESR pluses by generating an approximately helically shaped electromagnetic field.

7. An applicator for use in a magnetic resonance imaging apparatus comprising means for applying a magnetic field to a sample to be imaged, means for applying pulses of MR transition-exciting electromagnetic radiation to the sample, an MR signal detector for detecting the resulting radiation from the sample, and applicator means for applying pulses of the electromagnetic radiation to the sample, said pulses having a phase and having a frequency above 100 MHZ for stimulating coupled ESR transitions, wherein the applicator means comprises an electrical periodic structure having a length and constructed so as to oscillate with substantially the same phase over the whole length of the electrical periodic structure.

8. A method of magnetic resonance imaging comprising applying a magnetic field to a sample to be imaged, applying MR transition-exciting electromagnetic radiation to the sample, said electromagnetic radiation having a phase and having a frequency above 100 MHz, and detecting the resultant radiation with an MR signal detector, said method further including providing an electrical periodic structure having a length and constructed so as to oscillate with substantially the same phase over the entire length of the electrical periodic structure, applying the MR transition-exciting electromagnetic radiation to the sample via the electrical periodic structure, and detecting at least part of an MR signal with the electrical periodic structure.

9. A method of magnetic resonance imaging as claimed in claim 8 further comprising the step of applying the electromagnetic radiation for stimulating ESR transitions.

10. A method as claimed in claim 9 further comprising providing the electrical periodic structure constructed so as to oscillate with substantially the same phase over the whole length of the electrical periodic structure and performing with the electrical periodic structure a step selected from the group consisting of applying the MR transition exciting electromagnetic radiation, applying the radiation for stimulating said ESR transition, and detecting at least part of the MR signal.

11. A method as claimed in claim 8 wherein the step of applying the MR transition-exiting electromagnetic radiation to the sample comprises a step of applying the electromagnetic radiation to excite the nuclei spins in the sample.

12. A method as claimed in claim 8 wherein the step of applying the MR transition-exciting electromagnetic radiation to the sample comprises a step of applying the electromagnetic radiation to excite paramagnetic electron spins in the sample.

13. A method of magnetic resonance imaging comprising applying a magnetic field to a sample to be imaged, applying MR transition-exciting electromagnetic radiation to the sample, said electromagnetic radiation having a phase and having a frequency above 100 MHz, and detecting the resultant radiation with an MR signal detector, including providing at least one electrical periodic structure constructed so as to oscillate with substantially the same phase over the whole length of the electrical periodic structure, applying the MR transition-exciting electromagnetic radiation to the sample, and detecting at least part of an MR signal with the electrical periodic structure.

14. A method of magnetic resonance imaging as claimed in claim 13 further comprising the step of applying the electromagnetic radiation for stimulating ESR transitions.

15. A method as claimed in claim 14 comprising applying the MR transition-exciting electromagnetic radiation to the sample, applying the radiation for stimulating said ESR transitions to the sample and detecting the MR signals with said at least one electrical periodic structure constructed so as to oscillate with substantially the same phase over the whole length of the electrical periodic structure.

16. A method as claimed in claim 13 wherein the step of applying the MR transition-exciting electromagnetic radiation to the sample comprises a step of applying the electromagnetic radiation to excite the nuclei spins in the sample.

17. A method as claimed in claim 13 wherein the step of applying the MR transition-exciting electromagnetic radiation to the sample comprises a step of applying the electromagnetic radiation to excite paramagnetic electron spins in the sample.

18. An apparatus for magnetic resonance imaging comprising means for applying a magnetic field to a sample to be imaged, means for applying MR transition-exciting electromagnetic radiation to the sample, said electromagnetic radiation having a phase and having a frequency above 100 MHZ, and an MR signal detector for detecting the resulting radiation, the improvement comprising an electrical periodic structure having a length and constructed so as to oscillate with substantially the same phase over the whole length of the electrical periodic structure, said electrical periodic structure further constructed for performing a function selected from the group consisting of applying the MR transition-exciting electromagnetic radiation, and functioning as part of the MR signal detector.

19. An apparatus as claimed in claim 18 further comprising means for applying the electromagnetic radiation for stimulating ESR transitions.

20. An apparatus as claimed in claim 19 wherein the means for applying the MR transition-exciting electromagnetic radiation to the sample comprises means for exciting the nuclei spins in the sample.

21. An apparatus as claimed in claim 19 wherein the means for applying the MR transition-exciting electromagnetic radiation to the sample comprises means for applying the electromagnetic radiation to excite paramagnetic electron spins in the sample.

22. An apparatus for magnetic resonance imaging comprising means for applying a magnetic field to a sample to be imaged, means for applying MR transition-exciting electromagnetic radiation to the sample, said electromagnetic radiation having a phase and having a frequency above 100 MHZ, and an MR signal detector for detecting the resulting radiation, the improvement comprising at least one electrical periodic structure having a length and constructed so as to oscillate with substantially the same phase over the whole length of the electrical periodic structure, the electrical periodic structure further constructed for applying the MR transition-exciting electromagnetic radiation, and functioning as part of the MR signal detector.

23. An apparatus for magnetic resonance imaging as claimed in claim 22 further comprising means for applying the electromagnetic radiation for stimulating ESR transitions.

24. An apparatus as claimed in claim 22 wherein the means for applying the MR transition-exciting electromagnetic radiation to the sample comprises means for exciting the nuclei spins in the sample.

25. An apparatus as claimed in claim 22 wherein the means for applying the MR transition-exciting electromagnetic radiation to the sample comprises means for exciting paramagnetic electron spins in the sample.

26. An applicator for coupling an electromagnetic field having a phase and having frequency above 100 MHz to a sample to be imaged by magnetic resonance imaging, said applicator comprising an electrical periodic structure having a length and for receiving an output signal from an oscillator and generating an approximately helically shaped electromagnetic field, said electrical periodic structure being constructed so as to oscillate with substantially the same phase over the whole length of the electrical periodic structure, and means to couple the approximately helically shaped electromagnetic field to the sample.

27. An applicator for coupling an electromagnetic field having a phase and having a frequency above 100 MHz to a sample to be imaged by magnetic resonance imaging comprising generating means for selecting and generating a VHF frequency, and an electrical periodic structure having a length and receiving a signal from said VHF frequency generating means and generating said electromagnetic field commensurate therewith, the electrical periodic structure being constructed so as to oscillate with substantially the same phase over the whole length of the electrical periodic structure to couple the electromagnetic field into the sample with a spatial variation approximately corresponding to a plane wave in the sample for the selected VHF frequency whereby said plane wave is excited.

28. In a magnetic resonance imaging apparatus employing either nuclear or electron spin resonance, the apparatus including means for generating a resonance signal and means for coupling the resonance signal to a sample, the improvement comprising applicator for generating and coupling an electromagnetic field to the sample, said electromagnetic field having a phase and having a frequency above 100 MHz, said applicator comprising an electrical periodic structure having a length and having a lengthwise axis, a plurality of successive sections for generating local magnetic fields, and means to twist the local magnetic fields by a certain angle around the lengthwise axis of the structure, so that the field forms a helix having a certain pitch, said electrical periodic structure oscillating with substantially the same phase over the whole length of the electrical periodic structure.

29. An applicator according to claim 28 in which the pitch of the helix is substantially equal to a wavelength in the sample of ESR pulses as to produce a plane wave.

30. An applicator for use in a magnetic resonance imaging apparatus employing either nuclear or electron spin resonance for coupling an electromagnetic field having a frequency above 100 MHz to a sample to be imaged by magnetic resonance imaging, said applicator comprising an electrical periodic structure having a length, said electrical periodic structure generating an electromagnetic field which oscillates with substantially the same phase over the whole length of the electrical periodic structure in response to an output signal received from an oscillator, said applicator further comprising means for generating a spin resonance signal, means for coupling the spin resonance signal to said electrical periodic structure and to the sample, and means for receiving the spin resonance signal.

31. An applicator according to claim 30 further comprising means for transmitting the spin resonance signal.

32. An applicator according to claim 30 further comprising, means to focus the electromagnetic field into some region of interest wherein said means to focus comprises means to counteract attenuation of the electromagnetic radiation in the sample so as to produce an approximately homogenous VHF field in at least part of said sample.

33. An applicator according to claim 32 wherein said means to focus comprises means to decrease noise coupling to the applicator from outside said region of interest.

34. An applicator according to claim 30 wherein said first period structure is linear and comprises series inductances alternating with shunt capacitances, and wherein said applicator further comprises a second linear periodic structure comprising series inductances alternating with shunt capacitances, the magnetic axes of the inductances of the first and second structures being perpendicular and the two structures being fed in quadrature.

35. An applicator according to claim 30 having coupled resonance circuits comprising pairs of coils tuned to slightly different frequencies.

\* \* \* \* \*